(12) United States Patent
Hsu et al.

(10) Patent No.: US 8,878,132 B2
(45) Date of Patent: Nov. 4, 2014

(54) PHOTOSENSOR DEVICE AND METHOD FOR DETERMINING INCIDENT LIGHT

(71) Applicants: En-Feng Hsu, Hsin-Chu (TW); Chin-Poh Pang, Hsin-Chu (TW)

(72) Inventors: En-Feng Hsu, Hsin-Chu (TW); Chin-Poh Pang, Hsin-Chu (TW)

(73) Assignee: Pixart Imaging Incorporation, R.O.C., Hsin-Chu (TW)

( * ) Notice: Subject to any disclaimer, the term of this patent is extended or adjusted under 35 U.S.C. 154(b) by 141 days.

(21) Appl. No.: 13/657,680

(22) Filed: Oct. 22, 2012

(65) Prior Publication Data
US 2014/0110581 A1    Apr. 24, 2014

(30) Foreign Application Priority Data
Oct. 25, 2011    (TW) ............................. 100138575 A

(51) Int. Cl.
*G01J 5/20*    (2006.01)
(52) U.S. Cl.
USPC ...................................................... 250/338.4
(58) Field of Classification Search
CPC .. G02B 5/281; H01L 27/14621; H01L 31/09; H01L 31/101; H01L 31/0232; G01J 5/20
USPC ............................................ 250/338.1–338.5
See application file for complete search history.

(56) References Cited

U.S. PATENT DOCUMENTS

| | | | | |
|---|---|---|---|---|
| 8,139,141 | B2 * | 3/2012 | Bamji et al. | 348/348 |
| 8,274,051 | B1 * | 9/2012 | Aswell et al. | 250/339.05 |
| 2008/0006762 | A1 * | 1/2008 | Fadell et al. | 250/201.1 |
| 2009/0050807 | A1 * | 2/2009 | Ota et al. | 250/338.1 |

* cited by examiner

*Primary Examiner* — Kiho Kim
(74) *Attorney, Agent, or Firm* — Tung & Associates

(57) ABSTRACT

A photosensor device includes a plurality of first well structures, a light shielding layer, and a plurality of second well structures. The first well structures are disposed in a substrate. The light shielding layer disposed is on the substrate; it covers a portion of the first well structures and exposes the rest portion of the first well structures. The covered first well structures are adjacent to the exposed first well structures exposed. The exposed first well structures generate a first photocurrent according to incident light. The second well structures generate a second photocurrent according to incident light. A total surface area of the second well structures is substantially equal to a total surface area of the exposed first well structures. A method for determining the incident light is also provided.

23 Claims, 11 Drawing Sheets

PHOTOSENSOR DEVICE AND METHOD FOR DETERMINING INCIDENT LIGHT

CROSS REFERENCE

The present invention claims priority to TW 100138575, filed on Oct. 25, 2011.

BACKGROUND OF THE INVENTION

1. Field of Invention

The present invention relates to a photosensor device, especially a photosensor device for determining incident light.

2. Description of Related Art

Due to low manufacturing cost and easy application, silicon photodiodes and phototransistors are often used to sense surrounding light, as ambient light sensors. Silicon photodiodes and phototransistors are also often integrated in integrated circuits.

However, for a silicon-based photosensor to sense and distinguish images for different environments, an optical filter (such as IR pass filter or IR filter) is usually required. This is because: the silicon-based photosensor has a much wider sensible range than human eyes with respect to wavelengths. The silicon-base photosensor can sense not only visible light but also infrared light, and therefore there are more noises. If the silicon-based photosensor is used to sense visible light in a normal environment, because it also receives infrared light, there are noises in the sensed image. On the other hand, if the silicon-based photosensor is used to sense infrared light, although the silicon-based photosensor may be in a dark environment, because the silicon-based photosensor also can sense visible light, the image sensed by the silicon-base photosensor has a high noise ratio due to the retrieved visible light.

SUMMARY OF THE INVENTION

The present invention provides a photosensor device, which can sense a spectrum signal of an incident light.

The invention also provides a method of determining incident light, which can measure a spectrum signal of the incident light.

The above and other objectives and advantages of the present invention can be further understood from the disclosed technical features in the invention.

The present invention provides a photosensor device, which comprises a plurality of first well structures, a light shielding layer, and a plurality of second well structures. The first well structures are disposed in a first substrate. The light shielding layer is disposed on the first substrate; it covers a portion of the first well structures, and exposes at least one first well structure. The first well structures covered by the light shielding layer are adjacent to the first well structure exposed by the light shielding layer, wherein the first well structure exposed by the light shielding layer is capable of generating a first photocurrent according to illumination of an incident light. The second well structures are disposed in a second substrate and capable of generating a second photocurrent according to illumination of the incident light, wherein a total surface area of the second well structures exposed on the second substrate is substantially equal to a total surface area of the first well structure exposed on the first substrate.

In a preferable embodiment of the present invention, the photosensor device respectively obtains a first spectrum signal and a second spectrum signal according to the first photocurrent and the second photocurrent. In another preferable embodiment, the photosensor device obtains a third spectrum signal by processing the first spectrum signal and the second spectrum signal. In one preferable embodiment, the third spectrum signal includes an infrared spectrum signal.

In a preferable embodiment of the present invention, the photosensor device further comprises a signal processing circuit for obtaining a spectrum signal of the incident light by processing the first photocurrent and the second photocurrent. In one preferable embodiment, the signal processing circuit includes a multiplexor, a signal converter, and a processing unit. The multiplexor includes a first input terminal, a second input terminal, and an output terminal, wherein the first input terminal of the multiplexor is electrically connected with the first well structure exposed by the light shielding layer to receive the first photocurrent, and the second input terminal of the multiplexor is electrically connected with the second well structure to receive the second photocurrent. The signal converter includes an input terminal and an output terminal, wherein the input terminal of the signal converter is electrically connected with the output terminal of the multiplexor. The processing unit includes an input terminal, wherein the output terminal of the signal converter is electrically connected with the input terminal of the processing unit.

In a preferable embodiment of the present invention, the first substrate and the second substrate are the same substrate.

In a preferable embodiment of the present invention, the first well structures covered by the light shielding layer are electrically connected with ground potential.

In a preferable embodiment of the present invention, an area of the first well structures exposed by the light shielding layer has a square or polygon opening shape.

In a preferable embodiment of the present invention, there are plural exposed first well structures, and the first well structures covered by the light shielding layer and the first well structures exposed by the light shielding layer are disposed in alternating order.

In a preferable embodiment of the present invention, the first well structures covered by the light shielding layer surround the periphery of each of the first well structures exposed by the light shielding layer.

The present invention provides a method of determining incident light, which can be applied to a photosensor device. The photosensor device comprises a plurality of first well structures, a light shielding layer, and a plurality of second well structures. The light shielding layer covers a portion of the first well structures, and exposes the rest portion of the first well structures. The first well structures covered by the light shielding layer are adjacent to the first well structures exposed by the light shielding layer. The method of determining incident light at least includes following steps: receiving the incident light by the first well structures exposed by the light shielding layer to generate a first photocurrent; receiving the incident light by the second well structures to generate a second photocurrent, wherein a total surface area of the second well structures exposed on the second substrate is substantially equal to a total surface area of the first well structures exposed by the light shielding layer on the first substrate; and obtaining the spectrum signal of the incident light according to the first photocurrent and the second photocurrent.

In a preferable embodiment of the present invention, the method of obtaining a spectrum signal of the incident light according to the first photocurrent and the second photocurrent includes following steps: receiving the first photocurrent and the second photocurrent by a signal processing circuit;

and processing the first photocurrent and the second photocurrent by the signal processing circuit to obtain a first spectrum signal and a second spectrum signal.

In a preferable embodiment of the present invention, the method of determining incident light further comprises: processing the first spectrum signal and the second spectrum signal to obtain an infrared spectrum signal. In one preferable embodiment, the infrared spectrum signal is obtained by deducting the first spectrum signal from the second spectrum signal. In another embodiment, the infrared spectrum signal is obtained by dividing one of the first spectrum signal and the second spectrum signal by the other.

In a preferable embodiment of the present invention, the method of determining incident light further comprises: electrically connecting the first well structures covered by the light shielding layer with ground potential.

In another embodiment, the present invention provides a photosensor device, which comprises a plurality of first well structures, an isolation well structure, and a plurality of second well structures. The first well structures are disposed in a first substrate. The isolation well structure is doped in the first substrate and disposed at the periphery of each of the first well structures to partition the first well structures, wherein the first well structures are capable of generating a first photocurrent according to an incident light. The second well structures are disposed in a second substrate and capable of generating a second photocurrent according to illumination of the incident light, wherein a total surface area of the second well structures exposed on the second substrate is substantially equal to a total surface area of the first well structures exposed on the first substrate.

In a preferable embodiment of the present invention, a depth of the isolation well structure is substantially deeper than a well depth of each of the first well structures.

In a preferable embodiment of the present invention, a width of the isolation well structure is substantially smaller than or equal to a well width of each of the first well structures.

In a preferable embodiment of the present invention, a doping concentration of the isolation well structure is substantially different from a doping concentration of the first well structures or a conductivity type of the isolation well structure is substantially different from a conductivity type of the first well structures.

In a preferable embodiment of the present invention, the isolation well structure is electrically connected with ground potential.

In a preferable embodiment of the present invention, the isolation well structure surrounds the periphery of each of the first well structures to partition the first well structures.

In another embodiment, the present invention provides a method of determining incident light, which at least includes following steps: receiving the incident light by a plurality of first well structures to generate a first photocurrent, wherein the first well structures are partitioned by an isolation well structure which surrounds the periphery of each of the first well structures; receiving the incident light by the second well structures to generate a second photocurrent, wherein a total surface area of the second well structures receiving the incident light is substantially equal to a total surface area of the first well structures receiving the incident light; and obtaining a spectrum signal of the incident light according to the first photocurrent and the second photocurrent.

In a preferable embodiment of the present invention, the method of obtaining a spectrum signal of the incident light according to the first photocurrent and the second photocurrent includes following steps: receiving the first photocurrent and the second photocurrent by a signal processing circuit; and processing the first photocurrent and the second photocurrent by the signal processing circuit to obtain a first spectrum signal and a second spectrum signal.

In a preferable embodiment of the present invention, the method of determining incident light further includes: obtaining an infrared spectrum signal by processing the first spectrum signal and the second spectrum signal.

In a preferable embodiment of the present invention, the infrared spectrum signal is obtained by deducting the first spectrum signal from the second spectrum signal.

In a preferable embodiment of the present invention, the infrared spectrum signal is obtained by dividing one of the first spectrum signal and the second spectrum signal by the other.

In a preferable embodiment of the present invention, the method of determining incident light further includes: electrically connecting the isolation well structure with ground potential.

According to the above, the embodiments of the present invention at least have one or more of the following features: in one embodiment, the first well structures are partially covered by the light shielding layer or isolated from one another by the isolation well structure, so that one first well structure receiving the incident light is not interfered by another nearby first well structure, and the first well structure receiving the incident light is capable of generating the first photocurrent. The second well structures receive the incident light to generate the second photocurrent, wherein a total surface area of the second well structures receiving the incident light is substantially equal to a total surface area of the first well structures exposed by the light shielding layer. As such, the photosensor device is able to obtain a spectrum signal of the incident light by processing the first photocurrent and the second photocurrent. The present invention also provides a method of determining incident light applicable to the aforementioned photosensor devices.

The objectives, technical details, features, and effects of the present invention will be better understood with regard to the detailed description of the embodiments below, with reference to the drawings.

DESCRIPTION OF THE PREFERRED EMBODIMENTS

The drawings as referred to throughout the description of the present invention are for illustration only, but not drawn according to actual scale. The orientation wordings in the descriptions such as: above, under, left, or right are for reference with respect to the drawings, but not for limiting the actual products made according of the present invention.

Figure 1:
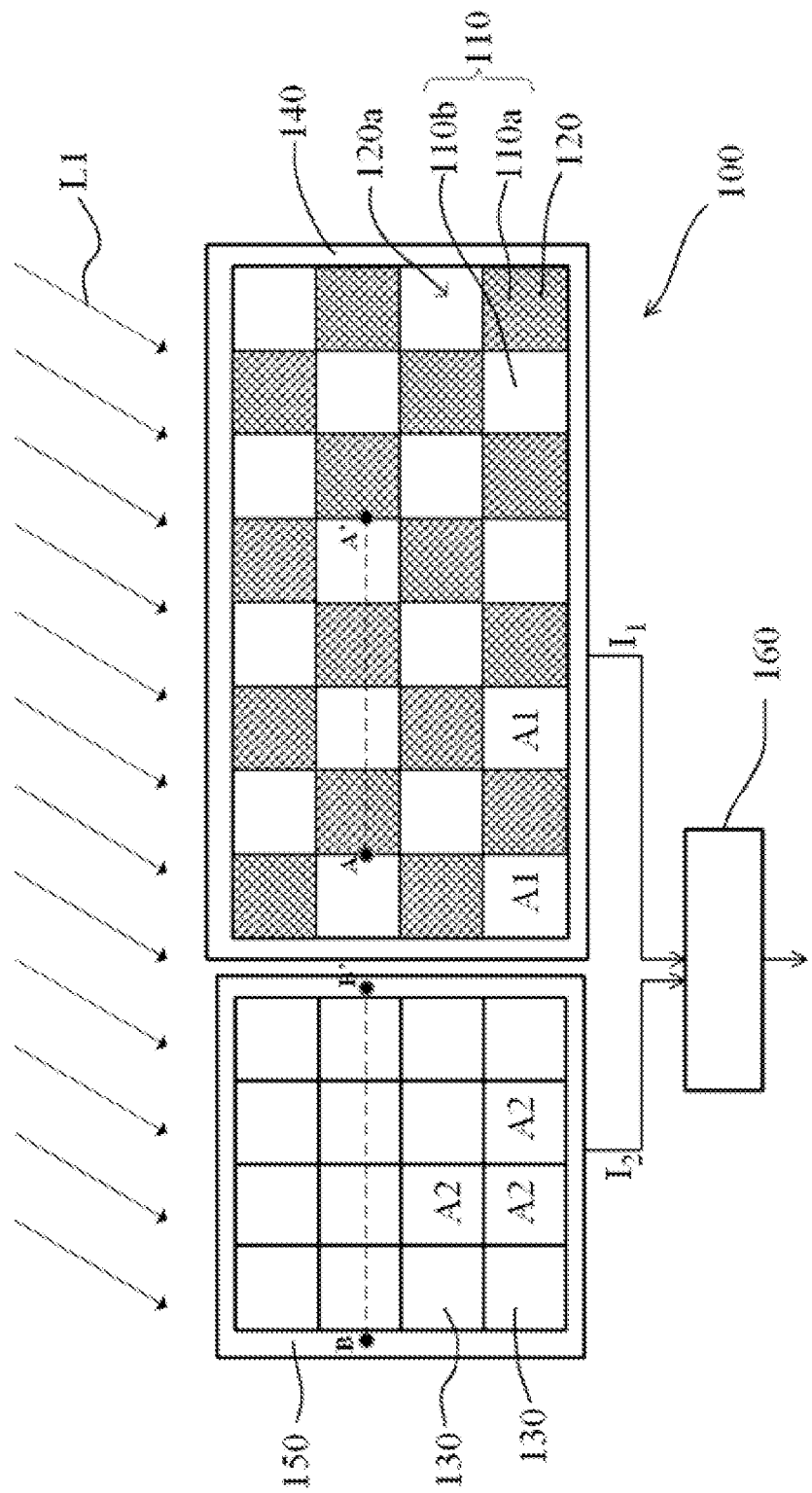
FIG. 1 shows an embodiment of a photosensor device according to the present invention.
Figure 2:
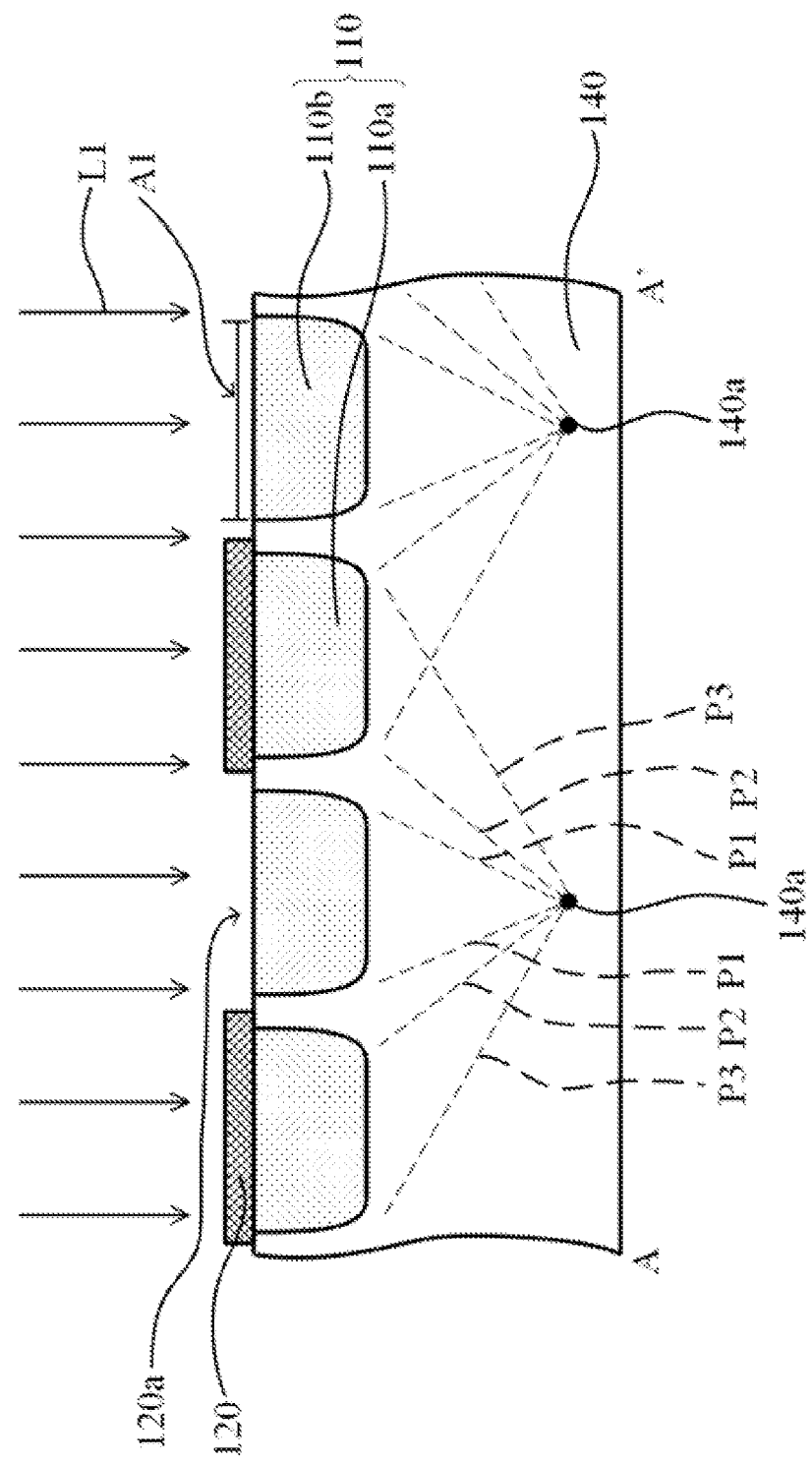
FIG. 2 shows a cross-section view according to AA' cross-section line shown in FIG. 1.
Figure 3:
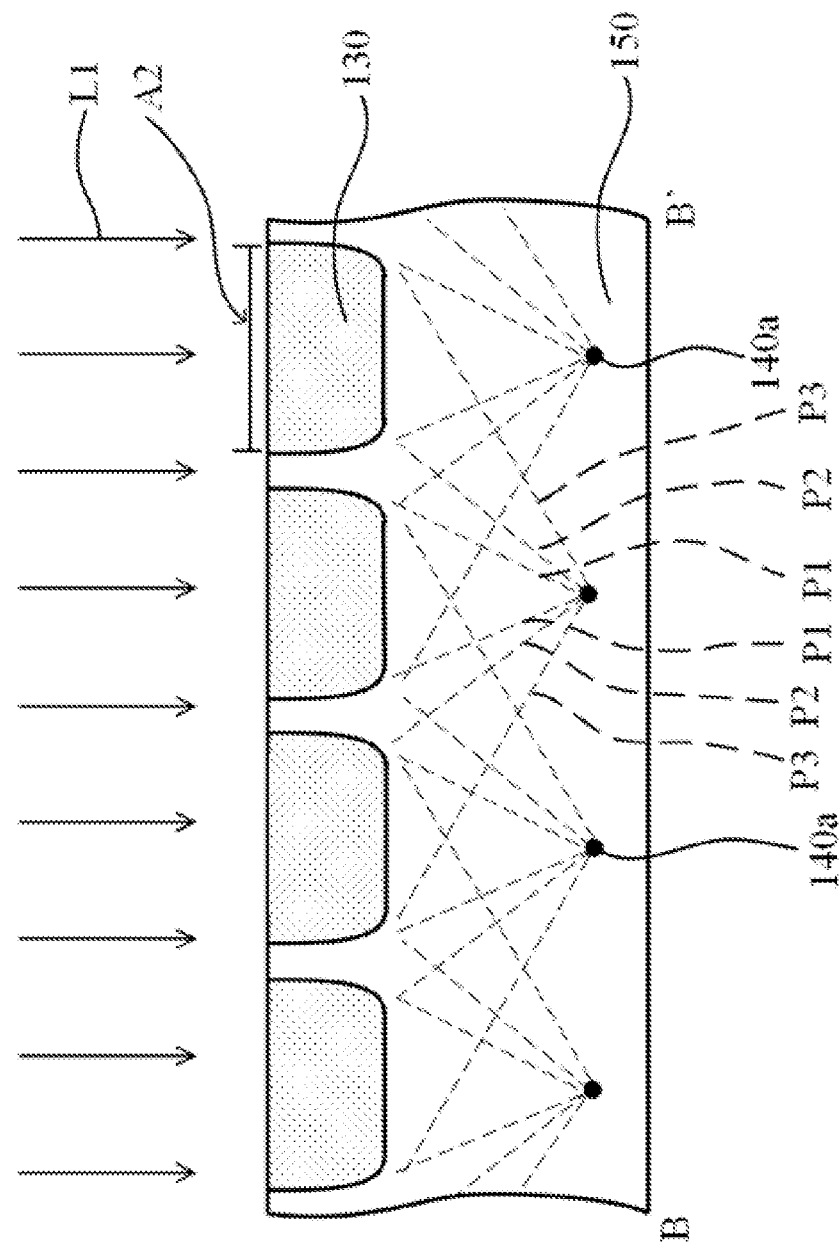
FIG. 3 shows a cross-section view according to BB' cross-section line shown in FIG. 1.

FIG. 1 shows a preferable embodiment of a photosensor device according to the present invention; FIG. 2 shows across section view according to the cross-section line AA' in FIG. 1; and FIG. 3 shows a cross section view according to the cross-section line BB' in FIG. 1. Refer to FIGS. 1-3, the photosensor device 100 includes a plurality of first well structures 110, a light shielding layer 120 and a plurality of second well structures 130. The first well structures 110 are disposed in a first substrate 140. In this embodiment, the first substrate 140 can be a P-type semiconductor substrate (such as a P-type silicon substrate), and the first well structures 110 can be N-type wells. However, the present invention is not limited by this example. In another embodiment, the first substrate 140 can be an N-type semiconductor substrate (such as an N-type silicon substrate), and the first well structures 110 can correspondingly be P-type wells; the conductivities can be arranged according to user's requirements and design. In this embodiment, the first well structures 110 are formed in the first substrate 140 by ion implantation which dopes N-type ions in the first substrate 140 to form the first well structures 110 shown in FIG. 1 and FIG. 2. In other embodiments, the user can adopt different doping methods to form the first well structures 110 in the first substrate 140, not limited to the above example. It should be noted that the first substrate 140 can be an intrinsic silicon substrate.

The light shielding layer 120 is disposed on the first substrate 140; the light shielding layer 120 covers a portion of the first well structures 110 and exposes the rest portion of the first well structures 110, as shown in FIG. 1 and FIG. 2. In this embodiment, the first well structures 110a covered by light shielding layer 120 are at the periphery of the first well structures 110b exposed by light shielding layer 120, and the exposed first well structures 110b are capable of receiving an incident light L1 to generate a first photocurrent $I_1$. More specifically, the incident light L1 can be an ambient light including wavelengths of visible light band, infrared light band, and/or ultraviolet light band. In addition, the light shielding layer 120 can be made of metal material or a material having light shielding effect, to block the light from penetration through the light shielding layer 120.

In detail, when the incident light L1 impinges on the photosensor device 100, because the first substrate 140 is a semiconductor substrate (such as a silicon substrate), the photons of the incident light L1 are absorbed by the first substrate 140 to generate hole-electro pairs. For visible light (having wavelengths of 400~700 nm), the absorption distance of the generated hole-electro pairs are about or less than 3.4 µm, that is, the hole-electro pairs will be absorbed by the first substrate 140 and recombine within the diffusion distance of 3.4 µm or less than 3.4 µm. Relatively, the absorption distance of the hole-electro pairs generated by light having a longer wavelength will be longer.

For example, the absorption distance of hole-electro pairs generated in the first substrate 140 by 800 nm wavelength light is about 8 µm; the absorption distance of the generated hole-electro pairs corresponding to 900 nm wavelength light is about 22 µm; the absorption distance of the generated hole-electro pairs corresponding to 1000 nm wavelength light is approximately 93 µm. In other words, longer wavelength of the incident light L1 will lengthen the diffusion distance of hole-electro pairs in the first substrate 140.

Referring to FIG. 2, according to the above mechanism, when the incident light L1 penetrates into the first substrate 140 under the first well structures 110b exposed by the light shielding layer 120, the photons of the incident light L1 are absorbed by the first substrate 140 and corresponding hole-electro pairs 140a are generated under the first well structures 110b exposed by the light shielding layer 120. The hole-electro pairs 140a generated by the incident light L1 will diffuse as shown by the diffusion paths P1, P2, and P3, to the first well structures 110 to generate photocurrents. The incident light L1 has a wide range of wavelengths, that is, it may contain visible light wavelengths and infrared light wavelengths. Thus, the hole-electro pairs generated by the infrared wavelength band of the incident light L1 will transmit to the adjacent first well structures 110a covered by the light shielding layer 120, as shown in FIG. 2 by the diffusion paths P2 and P3.

In this embodiment, the first well structures 110b exposed by the light shielding layer 120 can be electrically connected (such as connected in parallel) to a certain potential to output the first photocurrent $I_1$. In particular, because the first well structures 110a covered by light shielding layer 120 are adjacent to the first well structures 110b exposed by light shielding layer 120 (As shown in FIG. 1, the first well structures 110a covered by light shielding layer 120 and the first well structures 110b exposed by light shielding layer 120 are arranged in alternating order), the first well structures 110b exposed by light shielding layer 120 will less likely collect the hole-electro pairs generated under nearby first well structures 110b, and are less likely impacted thereby. In a preferable embodiment to provide a photosensor device 100 with a better sensitivity, the first well structures 110a covered by light shielding layer 120 can be electrically connected to ground potential, such that the photoelectrons collected by the covered first well structures 110a do not affect the performance of the photosensor device 100.

The second well structures 130 are disposed in a second substrate 150 and capable of receiving the incident light L1 to generate a second photocurrent $I_2$, wherein a total surface area A2 of the second well structures 130 exposed on the second substrate 150 is substantially equal to a total surface area A1 of the first well structures 110b exposed by the light shielding layer 120 on the first substrate 140, as shown in FIG. 1 and FIG. 3. In this embodiment, the second well structures 130 for example can have the same structure and formed by the same process as the first well structures 110. However, there is a difference that the second well structures 130 need not be covered by the light shielding layer 120, as shown in FIG. 3. Thus, each second well structure will collect the hole-electro pairs 140a generated beneath it, and also collect hole-electro pairs 140a generated under the nearby second well structures 130, because the infrared wavelength band of incident light L1 will generate hole-electro pairs 140a having a longer absorption distance (as shown by the diffusion paths P2 and P3).

Similarly, the second well structures 130 on second substrates 150 which are impinged by the incident light L1 can be electrically connected (such as connected in parallel) to a certain potential to output the second photocurrent $I_2$, wherein preferably, a total surface area A2 of the second well structures 130 exposed on the second substrate 150 is substantially equal to a total surface area A1 of the first well structures 110b exposed on the first substrate 140. Or, speaking in another way, a total surface area A2 of the second well structures 130 receiving the incident light L1 is essentially equal to a total surface area A1 of the first well structures 110b exposed by light shielding layer 120 to receive the incident light L1.

In this embodiment, the photosensor device 100 can respectively obtain a first spectrum signal S1 and a second spectrum signal S2 of the incident light according to the first photocurrent $I_1$ and the second photocurrent $I_2$. Please refer to FIG. 5A which shows a spectrum graph obtained from the first photocurrent $I_1$ and the second photocurrent $I_2$ shown in FIG. 1. The photosensor device 100 can obtain a third spectrum signal S3 of the incident light by processing the first spectrum signal S1 and the second spectrum signal S2, for example but not limited to deducting (subtracting) the first spectrum signal S1 from the second spectrum signal S2, or dividing one of the first spectrum signal S1 and the second spectrum signal by the other. FIG. 5B and FIG. 5C show different spectrum graphs obtained by processing the first spectrum signal and the second spectrum signal in FIG. 5A by different methods. Note that the illustrated processing methods are just examples but not limiting; the signals can be processed by other methods according to user requirements or different designs. In this embodiment, the third spectrum signal S3 obtained from processing the first spectrum signal S1 and the second spectrum signal S2 can be an infrared spectrum signal.

More specifically, the photosensor device 100 preferably includes a signal processing circuit 160 to receive the first photocurrent $I_1$ and the second light current $I_2$ and process the first photocurrent $I_1$ and the second photocurrent $I_2$ to obtain a spectrum signal of the incident light L1 (such as the aforementioned third spectrum signal S3). Please refer to FIG. 4, wherein a schematic circuit diagram of photosensor device of FIG. 1 is shown. In detail, the signal processing circuit 160 for example includes a multiplexor 162, a signal converter 164, and a processing unit 166. In this embodiment, the multiplexor 162 includes at least a first input terminal 162a, a second input terminal 162b, and an output terminal 162c. The first input terminal 162a of the multiplexor 162 can be electrically connected to the first well structures 110b exposed by the light shielding layer 120, to receive the first photocurrent $I_1$. And, the second input terminal 162b of the multiplexor 162 can be electrically connected to the second well structures 130, to receive the second photocurrent $I_2$.

Figure 4:
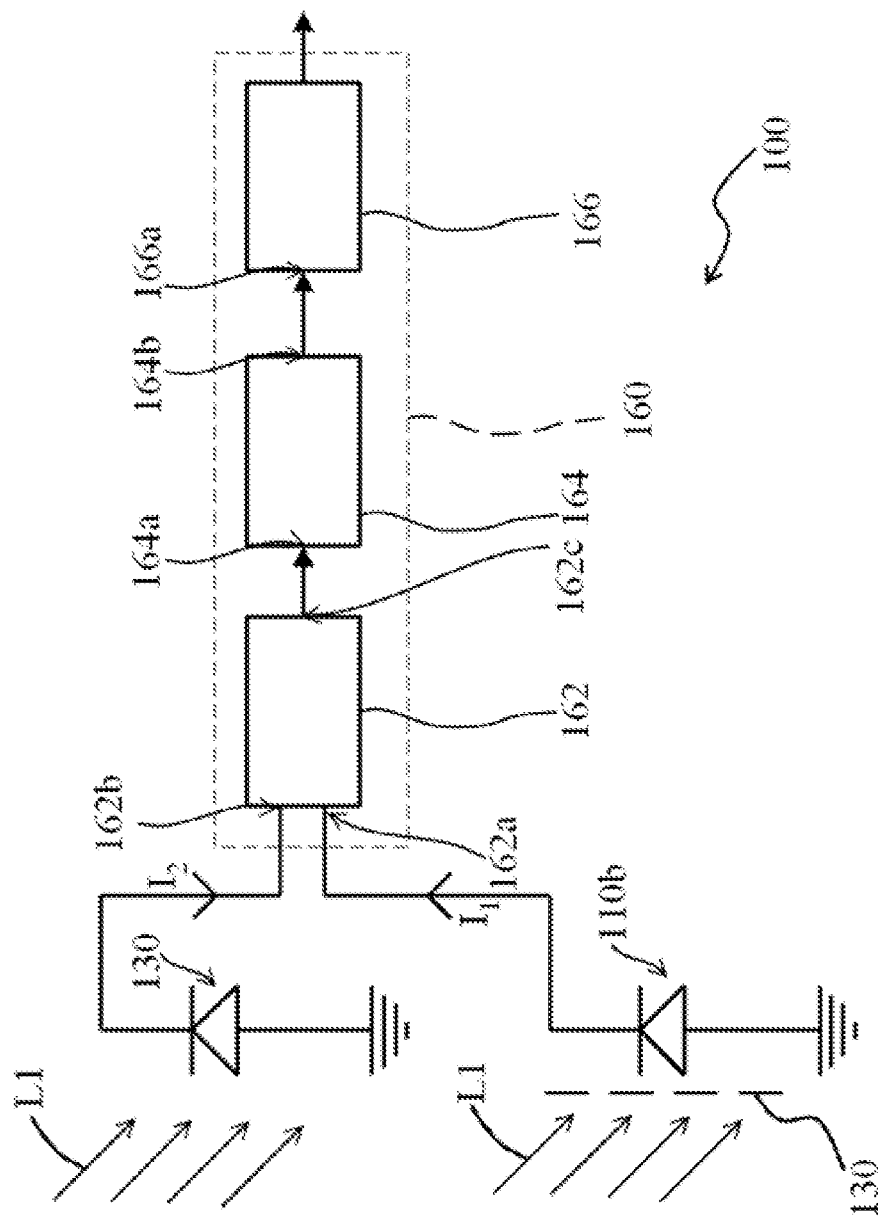
FIG. 4 shows a schematic circuit diagram corresponding to FIG. 1.

In addition, the signal converter 164 includes an input terminal 164a and an output terminal 164b, wherein the input terminal 164a of the electrical signal converter 164 is electrically connected to the output terminal 162c of the multiplexor 162, as shown in FIG. 4. In this embodiment, the signal converter 164 can be an analog to digital converter (A/D converter), for converting the first photocurrent $I_2$ signal and the second photocurrent $I_2$ signal into digital signals. Still referring to FIG. 4, the processing unit 166 includes an input terminal 166a, which is electrically connected to the output terminal 164b of the signal converter 164. In this embodiment, the processing unit 166 can be a hardware apparatus (such as a processor, a personal computer, etc.) or software (such as signal processing software, signal analysis software, etc.).

As illustrated in the above, the photosensor device 100 according to this embodiment covers a portion of the first well structures 110a and expose the rest portion of the first well structures 110b by the light shielding layer 120, wherein the first well structures 110a covered by the light shielding layer 120 are adjacent to the first well structures 110b exposed by the light shielding layer 120, such that the first well structures 110b exposed by light shielding layer 120 receive the incident light L1 to generate the first photocurrent $I_1$. As the first well structures 110a are adjacent to the first well structures 110b (as they are disposed in alternating order as shown in FIG. 1), and the first well structures 110a are covered by the light shielding layer 110, the incident light L1 will not penetrate below the first well structures 110a, and thus no hole-electro pairs are generated to affect adjacent first well structures 110b. The second well structures 130 of the photosensor device 100 also receive the incident light L1 and generate the second photocurrent $I_2$, wherein a total surface area A2 of the second well structures 130 receiving the incident light L1 is essentially equal to a total surface area A1 of the first well structures 110 exposed by the light shielding layer 120 under the incident light L1, and the second well structures 130 are adjacent to one another. As such, a spectrum signal of the incident light (such as the aforementioned third spectrum signal S3) can be obtained by processing the first photocurrent $I_1$ and the second photocurrent $I_2$.

Besides, in the foregoing photosensor device 100, the first substrate 140 and the second substrate 150 can be the same substrate or different substrates, depending on user's requirements. In this embodiment, the shape of each opening 120a of the first well structures 110b exposed by the light shielding layer 120 can be a square shape, as shown in FIG. 1. In other embodiments, the opening can have other opening shapes such as: circular, triangular, trapezoidal, pentagonal, or hexagonal shape, depending on user's requirements.

Figure 6:
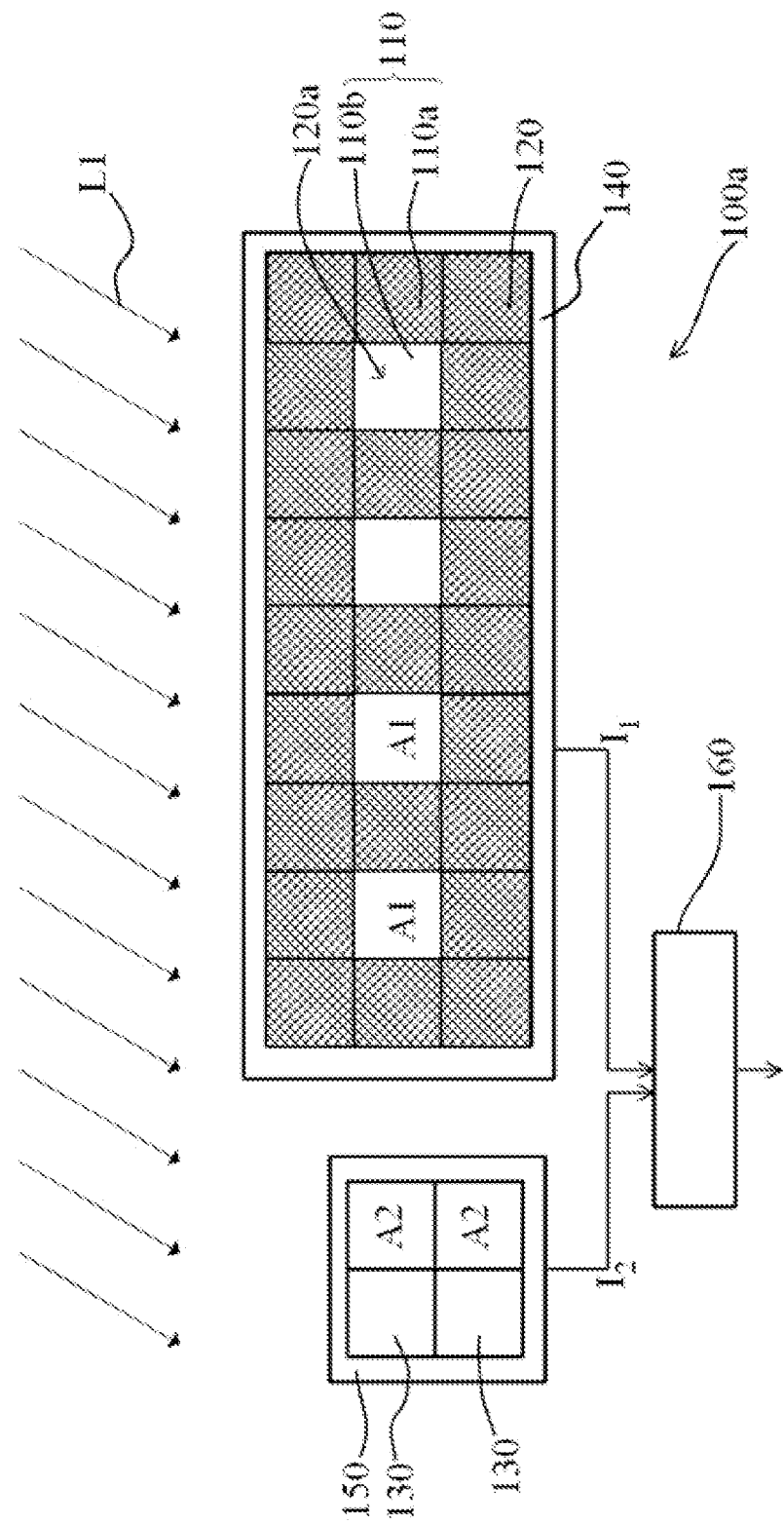
FIG. 6 shows another embodiment of the photosensor device according to the present invention.

Further, in order for the influence of the first well structures 110b less impacts on the adjacent first well structures 110b (as a specific example, to avoid collecting the hole-electro pairs generated under the nearby first well structures 110b), the first well structures 110a covered by the light shielding layer 120 can be arranged to surround the periphery of the first well structures 110b exposed by the light shielding layer 120, as shown in FIG. 6 which shows another embodiment of a photosensor device 100a. In particular, because the total surface area A1 of the first well structures 110b exposed by the light shielding layer 120 in this embodiment is four unit blocks, according to the principle described in the above, the total surface area A2 of the second well structures 130 should be correspondingly adjusted (to four unit blocks), so that the surface area A1 and the surface area A2 are substantially the same as shown in FIG. 6. Thus, the photosensor device 100a can obtain a desired spectrum signal of the incident light L1 by processing the first photocurrent $I_1$ and the second photocurrent $I_2$.

Figure 7:
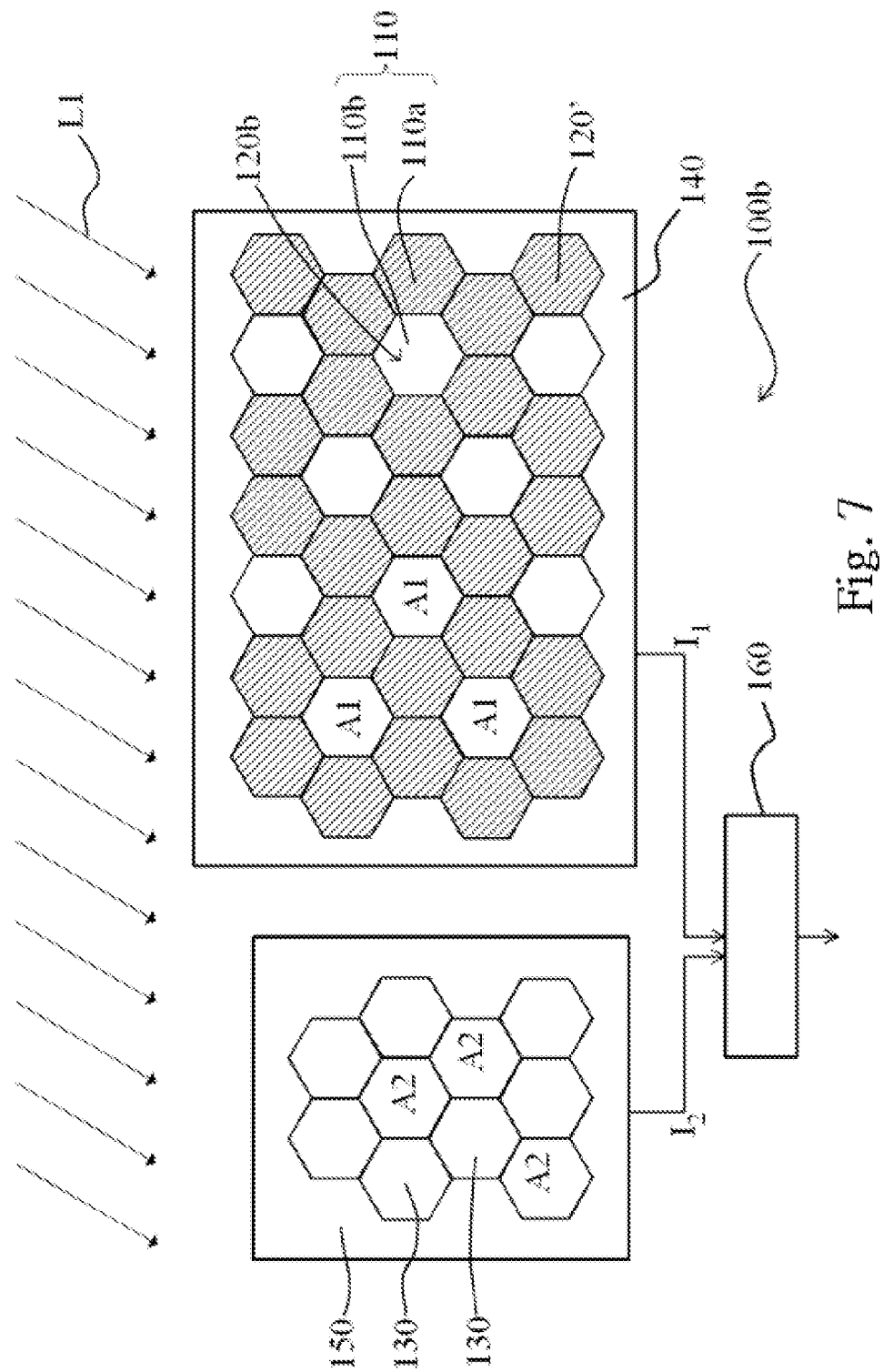
FIG. 7 shows yet another embodiment of the photosensor device according to the present invention.

FIG. 7 shows another embodiment of the photosensor device according to the present invention. Referring to FIGS. 1, 6 and 7, the photosensor device 100b adopts the same structure and principle as the photosensor devices 100 and 100a, except that the openings 120b of the light shielding layer 120' are hexagonal shape; as mentioned in the above, the opening 120b of the light shielding layer 120' can be adjusted according to user's requirements.

Because the photosensor device 100b adopts the same structure and principle as the photosensor devices 100 and 100a, for similar reasons, the photosensor device 100b can obtain a desired spectrum signal of the incident light L1 by processing the first photocurrent $I_1$ and the second photocurrent $I_2$.

Based on the above, the present invention also provides a method of determining incident light, applicable to a photosensor device adopting the above structure and principle such as the photosensor devices 100, 100a, and 100b, to measure the incident light L1. First, the first well structures 110b exposed by light shielding layer 120,120' receive an incident light L1 to generate the first photocurrent $I_1$. Meanwhile, the second well structures 130 also receive the incident light L1 to generate the second photocurrent $I_2$, wherein a total surface area A2 of the second well structures 130 exposed on the second substrate 150 is essentially equal to a total surface area A1 of the first well structures 110b exposed by the light shielding layer 120 or 120' on the first substrate 140. Then, the first photocurrent $I_1$ and the second photocurrent $I_2$ are processed to obtain the desired spectrum signal of the incident light L1.

In the foregoing method, the step of obtaining the desired spectrum signal of incident light L1 according to the first photocurrent $I_1$ and the second photocurrent $I_2$ for example includes: receiving the first photocurrent $I_1$ and the second photocurrent $I_2$ by the signal processing circuit 160; and processing the first photocurrent $I_1$ and the second photocurrent $I_2$ by the signal processing circuit 160 to respectively obtain the first spectrum signal S1 and the second spectrum signal S2 of the incident light L1, as described in the foregoing embodiments.

In addition, the step of processing the first photocurrent $I_1$ and the second photocurrent $I_2$ can obtain an infrared spectrum signal S3 of the incident light L1 by processing the first spectrum signal S1 and the second spectrum signal S2. In one embodiment, the infrared spectrum signal S3 can be obtained by deducting the first spectrum signal S1 from the second spectrum signal S2, as shown in FIG. 5B. Or in another embodiment, the infrared spectrum signal S3 can be obtained by dividing one of the first spectrum signal S1 and the second spectrum signal S2 by the other and normalizing the result to obtain the infrared spectrum signal S3, as shown in FIG. 5C.

Figure 8:
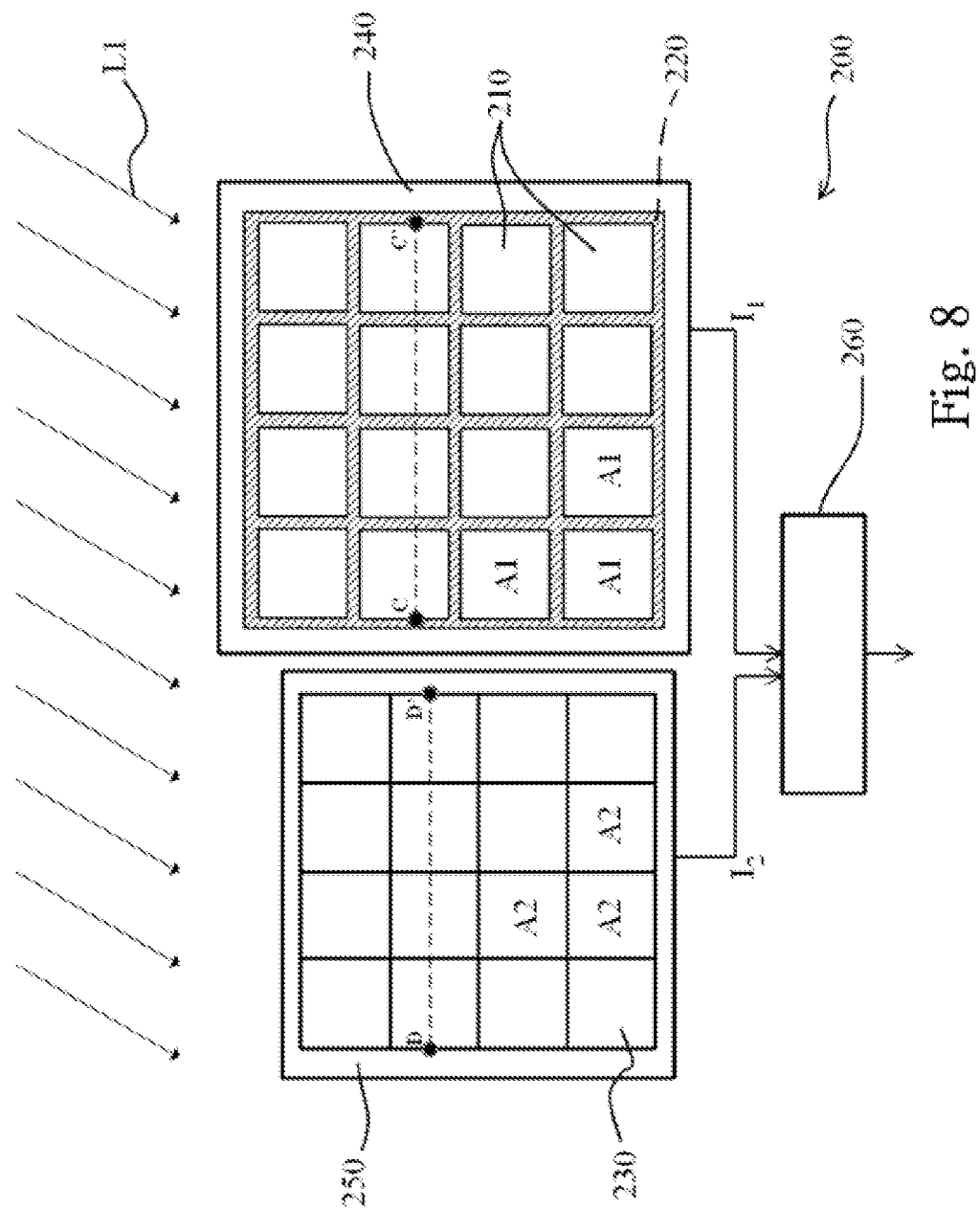
FIG. 8 shows yet another embodiment of the photosensor device according to the present invention.
Figure 9:
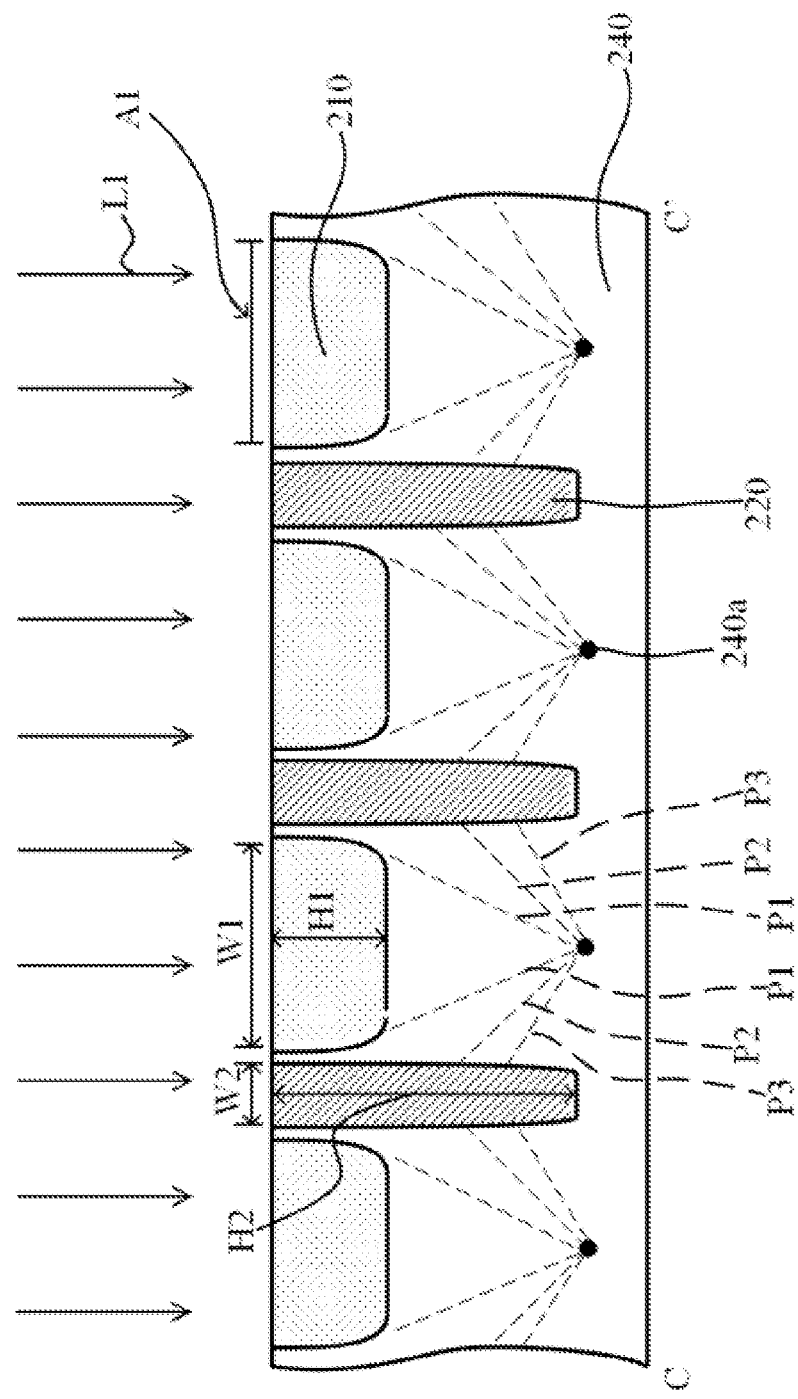
FIG. 9 shows a cross section view according to the CC' cross-section line shown in FIG. 8.
Figure 10:
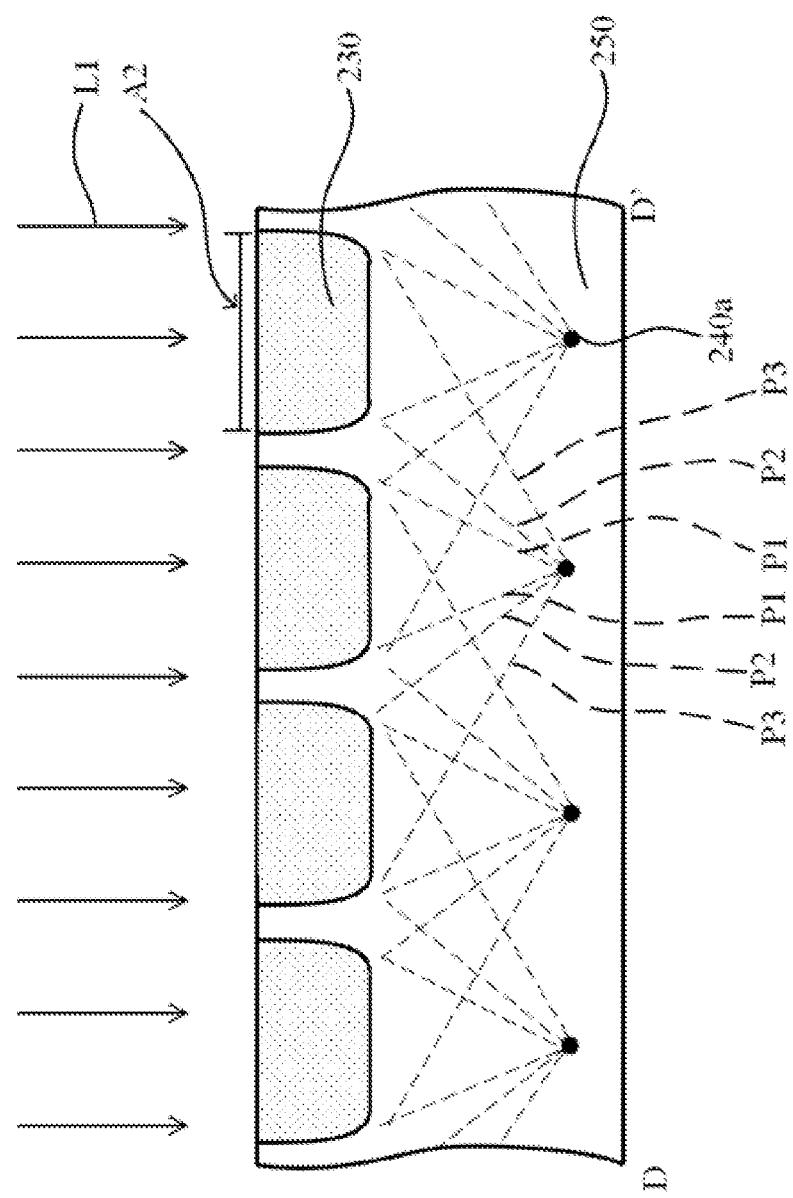
FIG. 10 shows a cross section view according to the DD' cross-section line shown in FIG. 8.

FIG. 8 shows another embodiment of photosensor device according to the present invention; FIG. 9 shows a cross section according to the cross-section line CC' in FIG. 8, and FIG. 10 shows a cross section according to the cross-section line DD' in FIG. 8. Referring to FIGS. 8 and 9, the photosensor device 200 includes a plurality of first well structures 210, an isolation well structure 220, and a plurality of second well structures 230. The first well structures 210 are disposed in a first substrate 240. In this embodiment, the first substrate 240 can be a P-type semiconductor substrate (such as a P-type silicon substrate), and the first well structures 210 can be N-type wells, but the present invention is not limited to this example. In another embodiment, the first substrate 240 can be an N-type semiconductor substrate (such as an N-type silicon substrate), and the first well structures 210 can be P-type wells, as determined by user's requirements and design.

In this embodiment, the first well structures 210 are formed in the first substrate 240 by ion implantation which dopes N-type ions in the first substrate 240 to form the first well structures 210 as shown in FIG. 8 and FIG. 9. In other embodiments, the user can dope N-type impurities in the first substrate 240 to form the first well structures 210 by other methods, not limited to the above example.

The isolation well structure 220 is formed in the first substrate 240, and the isolation well structure 220 is disposed at the periphery of each of the first well structures 210 to partition the first well structures 210, as shown in FIG. 8 and FIG. 9. The first well structures 210 partitioned by the isolation well structure 220 are capable of generating a first photocurrent $I_1$ according to the incident light L1. Similar to the previous embodiments, when the incident light L1 impinges on the photosensor device 200, hole-electro pairs 240a are generated beneath the first well structures 210. In order to prevent the hole-electro pairs 240a generated under one first well structure 210 from transmitting to another adjacent first well structure 210 or to reduce the possibility, the isolation well structure 220 partitions the two adjacent first well structures 210. Thus, the hole-electro pairs 240a generated under one first well structure 210 less likely transmit to its adjacent first well structures 210, and less likely impact the adjacent first well structures 210. In this embodiment, the first well structures 210 can be electrically connected (such as electrically connected in parallel) to a certain potential to output the first photocurrent $I_1$.

In particular, to more effectively prevent the hole-electro pairs 240a generated under one first well structure 210 from transmitting to another adjacent first well structure 210, the depth H2 of the isolation well structure 220 is preferably substantially deeper than the depth H1 of the first well structures 210. Further, optionally, the width W2 of the isolation well structure 220 is preferably substantially smaller than or equal to the width W1 of the first well structures 210, but this is not limiting. Similar to the previous embodiments, for the photosensor device 200 to have a better sensitivity, the isolation well structure 220 can be electrically connected to ground potential, so that the collected photoelectrons do not affect the performance of the photosensor device 200.

Besides, for the isolation well structure to have a better isolation effect, the doping concentration of the isolation well structure 220 can be substantially different from the doping concentration of the first well structures 210, or the conductivity of the isolation well structure 220 can be substantially different from the conductivity of the first well structures 210. Specifically, the doping concentration of the isolation well structure 220 can be higher, equal to, or less than the doping concentration of the first well structures 210. Or, the doping type (conductivity) of the isolation well structure 220 can be the same or different from the doping type (conductivity) of the first well structures 210, depending on user's requirements. In this embodiment, as an example, the doping concentration of the isolation well structure 220 is higher than the ion doping concentration of the first well structures 210.

Further, to more effectively prevent the hole-electro pairs 240a generated under one first well structure 210 from transmitting to another adjacent first well structure 210, the isolation well structure 220 can be arranged to surround the periphery of the first well structures 210, as shown in FIG. 8 and FIG. 9. In particular, the isolation well structure 220 can be formed in the first substrate 240 by ion implantation which dopes impurities into first substrate 240, to form the isolation well structure 220 as shown in FIG. 8 and FIG. 9, in which the doping type of the isolation well structure 220 can be N-type or P-type.

Furthermore, the second well structures 230 are disposed in a second substrate 250 and capable of generating a second photocurrent $I_2$ according to the incident light L1, in which a total surface area A2 of the second well structures 230 exposed on the second substrate 250 is essentially equal to a total surface area A1 of the first well structures 210 exposed on the first substrate 240, as shown in FIGS. 8-10. In this embodiment, the second well structures 230 can adopt the same structure and formed by the same process as the first well structures 210, except there is a difference that the second well structures 230 are not partitioned by the isolation well structure 220, as shown in FIG. 10. In FIG. 10, each second well structure 230 collect not only the hole-electro pairs 240a generated beneath it, but also the hole-electro pairs 240a generated under adjacent second well structures 230. The reason for this is that the infrared wavelength band in the incident light L1 generates hole-electro pairs 240a with a longer absorption distance (such as the diffusion paths P2 and P3).

Similar to the previous embodiments, the second well structures 230 on the second substrate 250 can be electrically connected (such as electrically connected in parallel) to a certain potential to output the second photocurrent $I_2$.

Figure 5A:
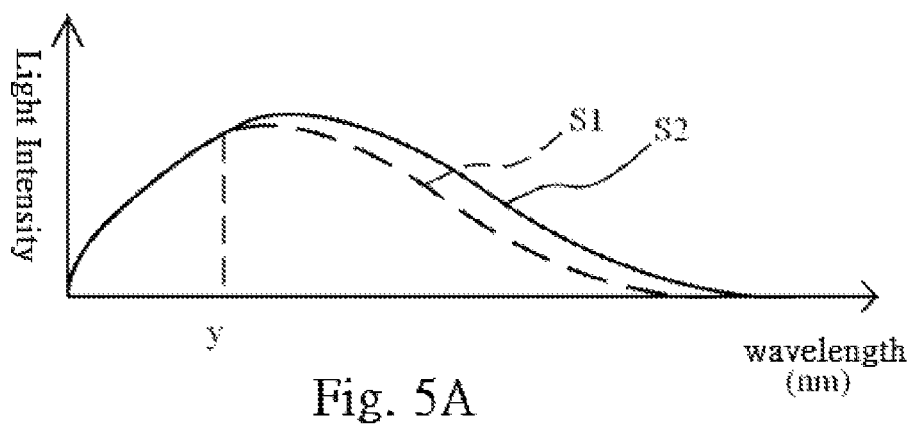
FIG. 5A shows a spectrum graph corresponding to the first photocurrent and the second photocurrent shown in FIG. 1.
Figure 5B:
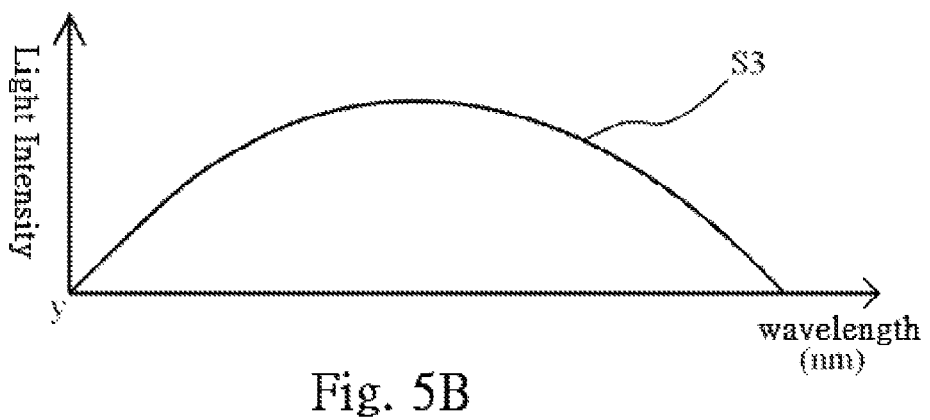
FIG. 5B and FIG. 5C are spectrum graphs respectively corresponding to the first spectrum signal and the second spectrum signal shown in FIG. 5A after different processings.
Figure 5C:
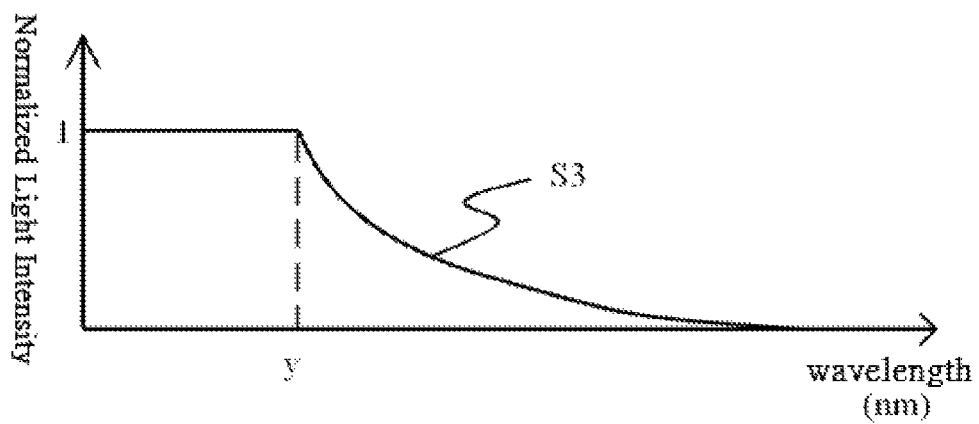

Similar to the principles and mechanisms of the foregoing photosensor device 100, 100a, and 100b, the photosensor device 200 of this embodiment can respectively obtain the first spectrum signal S1 and the second spectrum signal S2 of the incident light L1 according to the first photocurrent $I_1$ and second photocurrent $I_2$, and then process the first spectrum signal S1 and the second spectrum signal S2 to obtain a desired spectrum signal of the incident light L1; the details have been described in the foregoing description related to FIGS. 5A-5C. In order to process the first photocurrent $I_1$ and second photocurrent $I_2$, in this embodiment, a signal processing circuit 260 similar to the aforementioned signal processing circuit 160 can be provided, and the details thereof are omitted.

According to the above, the photosensor device 200 partitions the first well structures 210 to isolate them one from another by the isolation well structure 220, so as to prevent the hole-electro pairs 240a generated under one first well structure 210 from transmitting to another adjacent first well structure 210 or to reduce the possibility so that the adjacent first well structure 210 is less impacted, in which the first well structures 210 are capable of generating the first photocurrent $I_1$ according to the incident light L1. On the other hand, the second well structures 230 also receive the incident light L1 to generate the second photocurrent $I_2$. A total surface area A2 of the second well structures 230 exposed on the second substrate 250 is essentially equal to a total surface area A1 of the first well structures 210 exposed on the first substrate 240, and the second well structures 230 are adjacent to one another. Thus, a desired spectrum signal (such as the aforementioned third spectrum signal S3) of the incident light can be obtained by processing the first photocurrent $I_1$ and the second photocurrent $I_2$.

According to the above, in one embodiment, the present invention also provides a method of determining incident light, which can be applied to the aforementioned photosensor device 200. First, the first well structures 210 receive the incident light L1 to generate the first photocurrent $I_1$, wherein the first well structures 210 are partitioned by the isolation well structure 220 surrounding the periphery of the first well structures 210. the second well structures 210 also receive the incident light L1 to generate the second photocurrent $I_2$, wherein a total surface area A2 of the second well structures 210 receiving the incident light L1 is essentially equal to a total surface area A1 of the first well structures 210 receiving the incident light L1. Then, the spectrum signal of the incident light can be obtained according to the first photocurrent $I_1$ and the second photocurrent $I_2$.

In the foregoing method, preferably, the isolation well structure 220 can be electrically connected to ground potential, in order to prevent the photoelectrons collected by the isolation well structure 220 from impacting the performance of the photosensor device 200.

In summary, the photosensor devices and methods of determining incident light according to the present invention at least include one or more of the following features. In one of the embodiments, the light shielding layer is used to cover a portion of the first well structures and expose the rest portion of the first well structures, and the first well structures exposed by the light shielding layer receive the incident light to generate the first photocurrent, wherein the shielded first well structures are adjacent to the exposed first well structures, so that the incident light will not penetrate beneath the first well structures covered by the light shielding layer, and no hole-electro pairs are generated to affect the nearby exposed first well structures. Meanwhile, the second well structures receive the incident light to generate the second photocurrent, wherein a total surface area of the second well structures receiving the incident light is substantially equal to a total surface area of the first well structures exposed by the light shielding layer to receive the incident light, and the second well structures are adjacent to one another. Thus, the photosensor device can obtain a desired spectrum signal of the incident light signal by processing the first photocurrent and the second photocurrent.

In another embodiment, the isolation well structure is used to isolate a plurality of first well structures from one another, and thus the hole-electro pairs generated under one first well structure do not transmit to another adjacent first well structure, so that they do not impact the adjacent first well structure, wherein the first well structures isolated by the isolation well structure are capable of generating the first photocurrent well structure according to the incident light to. The second well structures also receive the incident light to generate the second photocurrent, wherein a total surface area of the second well structures exposed on the second substrate is substantially equal to a total surface area of the first well structures exposed on the first substrate, and the second well structures are adjacent to one another. Thus, the photosensor device can obtain a desired spectrum signal of the incident light by processing the first photocurrent and the second photocurrent.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. An embodiment or a claim of the present invention does not need to attain or include all the objectives, advantages or features described in the above. The abstract and the title are provided for assisting searches and not to be read as limitations to the scope of the present invention.

What is claimed is:

1. A photosensor device, comprising:
    a plurality of first well structures, disposed in a first substrate;
    a light shielding layer, covering a portion of the first well structures and exposing at least one first well structure, the first well structures covered by the light shielding layer being adjacent to the first well structure exposed by the light shielding layer, wherein the first well structure exposed by the light shielding layer is capable of generating a first photocurrent according to illumination of an incident light; and
    at least one second well structure, disposed in a second substrate and capable of generating a second photocurrent according to illumination of the incident light, wherein a total surface area of the second well structure exposed under the incident light is equal to a total surface area of the first well structure exposed by the light shielding layer.

2. The photosensor device of claim 1, wherein the photosensor device respectively obtains a first spectrum signal and a second spectrum signal according to the first photocurrent and the second photocurrent.

3. The photosensor device of claim 2, wherein the photosensor device obtains a third spectrum signal by processing the first spectrum signal and the first spectrum signal.

4. The photosensor device of claim 3, wherein the third spectrum signal includes an infrared spectrum signal.

5. The photosensor device of claim 1, further comprising a signal processing circuit for obtaining a spectrum signal of the incident light by processing the first photocurrent and the second photocurrent.

6. The photosensor device of claim 5, wherein the signal processing circuit includes:
    a multiplexor, including a first input terminal, a second input terminal, and an output terminal, wherein the first input terminal of the multiplexor is electrically connected with the first well structure exposed by the light shielding layer to receive the first photocurrent, and the second input terminal of the multiplexor is electrically connected with the second well structure to receive the second photocurrent;
    a signal converter, including an input terminal and an output terminal, wherein the input terminal of the signal converter is electrically connected with the output terminal of the multiplexor; and
    a processing unit, including an input terminal, wherein the output terminal of the signal converter is electrically connected with the input terminal of the processing unit.

7. The photosensor device of claim 1, wherein the first well structures and the at least one second well structure are disposed in the same substrate or different substrates.

8. The photosensor device of claim 1, wherein the first well structures and the at least one second well structure have the same or different conductivities.

9. The photosensor device of claim 1, wherein the first well structures covered by the light shielding layer are electrically connected with ground potential.

10. The photosensor device of claim 1, wherein an area of the first well structures exposed by the light shielding layer has a square or polygon opening shape.

11. The photosensor device of claim 1, wherein the first well structures covered by the light shielding layer and the first well structures exposed by the light shielding layer are disposed in alternating order.

12. The photosensor device of claim 1, wherein the first well structures covered by the light shielding layer surround the periphery of each of the first well structures exposed by the light shielding layer.

13. A photosensor device, comprising:
    a plurality of first well structures;
    an isolation well structure, disposed at a periphery of each of the first well structures to partition the first well structures, wherein the first well structures are capable of generating a first photocurrent according to illumination of an incident light; and
    a plurality of second well structures, being capable of generating a second photocurrent according to the incident light, wherein a total surface area of the second well structures illuminated by the incident light is equal to a total surface area of the first well structures illuminated by the incident light.

14. The photosensor device of claim 13, wherein a depth of the isolation well structure is deeper than a depth of each of the first well structures.

15. The photosensor device of claim 13, wherein a width of the isolation well structure is smaller than or equal to a width of each of the first well structures.

16. The photosensor device of claim 13, wherein a doping concentration of the isolation well structure is substantially different from a doping concentration of the first well structures or a conductivity type of the isolation well structure is substantially different from a conductivity type of the first well structures.

17. The photosensor device of claim 13, wherein the isolation well structure is electrically connected with ground potential.

18. The photosensor device of claim 13, wherein the isolation well structure surrounds the periphery of each of the first well structures to partition the first well structures.

19. A method of determining an incident light, comprising:
    receiving the incident light by at least one first well structure to generate a first photocurrent;
    receiving the incident light by at least one second well structure to generate a second photocurrent; and
    obtaining a spectrum signal of the incident light according to the first photocurrent and the second photocurrent;
    wherein a total surface area of the second well structure or structures receiving the incident light is equal to a total surface area of the first well structure or structures receiving the incident light.

20. The method of claim 19, wherein the step of obtaining the spectrum signal of the incident light according to the first photocurrent and the second photocurrent comprising:
    receiving the first photocurrent and the second photocurrent by a signal processing circuit; and
    processing the first photocurrent and the second photocurrent by the signal processing circuit to respectively obtain a first spectrum signal and a second spectrum signal.

21. The method of claim 20, further comprising:
    processing the first spectrum signal and the second spectrum signal to obtain an infrared spectrum signal.

22. The method of claim 21, wherein the step of processing the first spectrum signal and the second spectrum signal includes:
    deducting the first spectrum signal from the second spectrum signal to obtain the infrared spectrum signal.

23. The method of claim 21, further comprising:
    dividing one of the first spectrum signal and the second spectrum signal by the other to obtain the infrared spectrum signal.

* * * * *